United States Patent [19]
Ramalingam

[11] Patent Number: 5,298,136
[45] Date of Patent: Mar. 29, 1994

[54] STEERED ARC COATING WITH THICK TARGETS

[75] Inventor: Subbiah Ramalingam, Roseville, Minn.

[73] Assignee: Regents of the University of Minnesota, Minneapolis, Minn.

[21] Appl. No.: 86,552

[22] Filed: Aug. 18, 1987

[51] Int. Cl.$^5$ .................................. C23C 14/22
[52] U.S. Cl. ..................... 204/192.38; 204/298.41
[58] Field of Search ............. 204/192.12, 192.38, 204/298.17, 298.18, 298.19, 298.20, 298.41

[56] References Cited

U.S. PATENT DOCUMENTS

| | | | |
|---|---|---|---|
| 3,628,948 | 12/1971 | Bruning | 75/10 |
| 3,689,740 | 9/1972 | De Corso et al. | 219/383 |
| 3,878,085 | 4/1975 | Corbani | 204/298.19 |
| 3,956,093 | 5/1976 | McLeod | 204/192 |
| 4,219,722 | 8/1980 | Rudd et al. | 219/123 |
| 4,444,635 | 4/1984 | Kobayashi et al. | 204/192 R |
| 4,563,262 | 1/1986 | Sablev et al. | 204/298 |
| 4,673,477 | 6/1987 | Ramalingam et al. | 204/192.38 |
| 4,724,058 | 2/1988 | Morrison, Jr. | 204/192.38 |

FOREIGN PATENT DOCUMENTS 363375  3/1970  U.S.S.R.

OTHER PUBLICATIONS

John L. Vossen et al, Thin Film Processes, Academic Press, New York, 1978, pp. 76–83, 131–163.
Brian Chapman, Glow Discharge Processes, John Wiley & Sons, New York, 1990, pp. 260–271.
Pulsed Metallic-Plasma Generators by Alexander S. Gilmour, Jr. et al., Proceedings of the IEEE, vol. 60, No. 8, Aug. 1972.
Front page of PCT International Publication No. WO 85/03954 (International Application No. PCT/US85/00312, filed Feb. 27, 1985).
Drawings from U.S. Patent Application Serial No. 06/848,720, filed Apr. 4, 1986 (pending in Group Art Unit 112).
Vacuum Erosion-Type Generators and Plasma Accelerators Working On Alternating Current, Plenum Publishing Corporation, Document 0018-151X/80/1805, pp. 0821–0830, 1981 (translated from Teplofizika Vysokikh Temperatur, vol. 18, No. 5, Sep.–Oct. 1980. N. E. Bauman Moscow Higher Technical School).

*Primary Examiner*—John Niebling
*Assistant Examiner*—William T. Leader
*Attorney, Agent, or Firm*—Westman, Champlin & Kelly

[57] ABSTRACT

A process and apparatus for controlled arc coating of substrates utilizing relatively thick cathodes or targets for obtaining coatings which are free of macro-particles. The thick targets are capable of use by controlling and steering the arc in a desired path as necessary to produce coatings of the desired compositions using magnetic fields generated to provide arc path control and modulation for efficient cathode utilization.

28 Claims, 5 Drawing Sheets

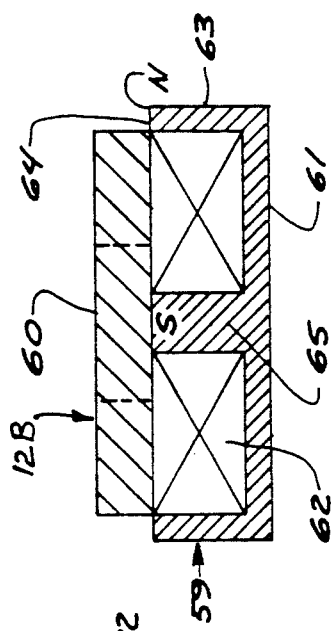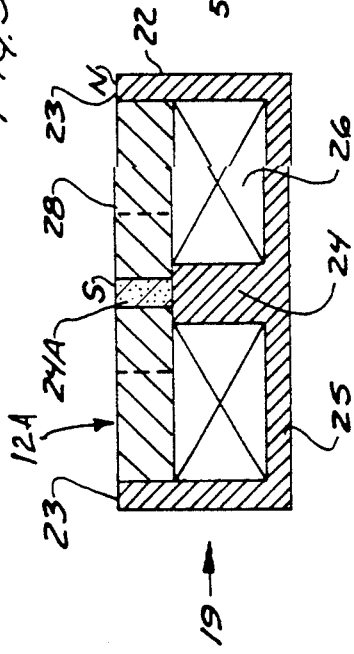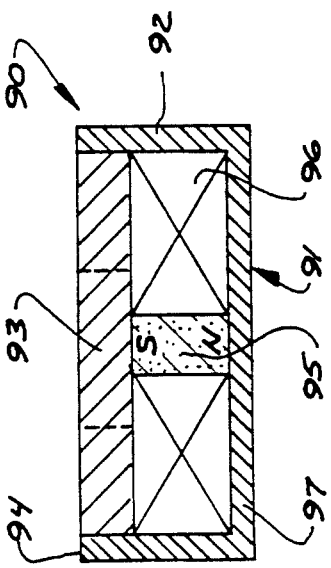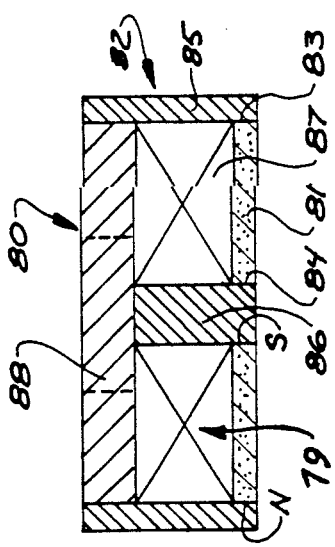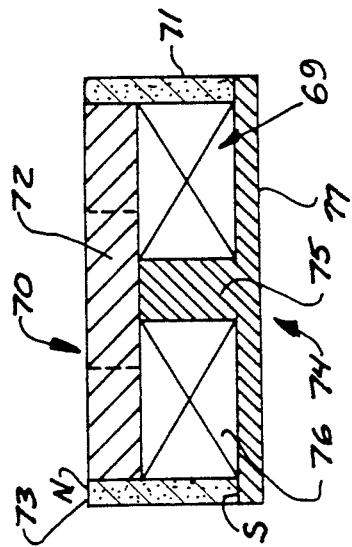

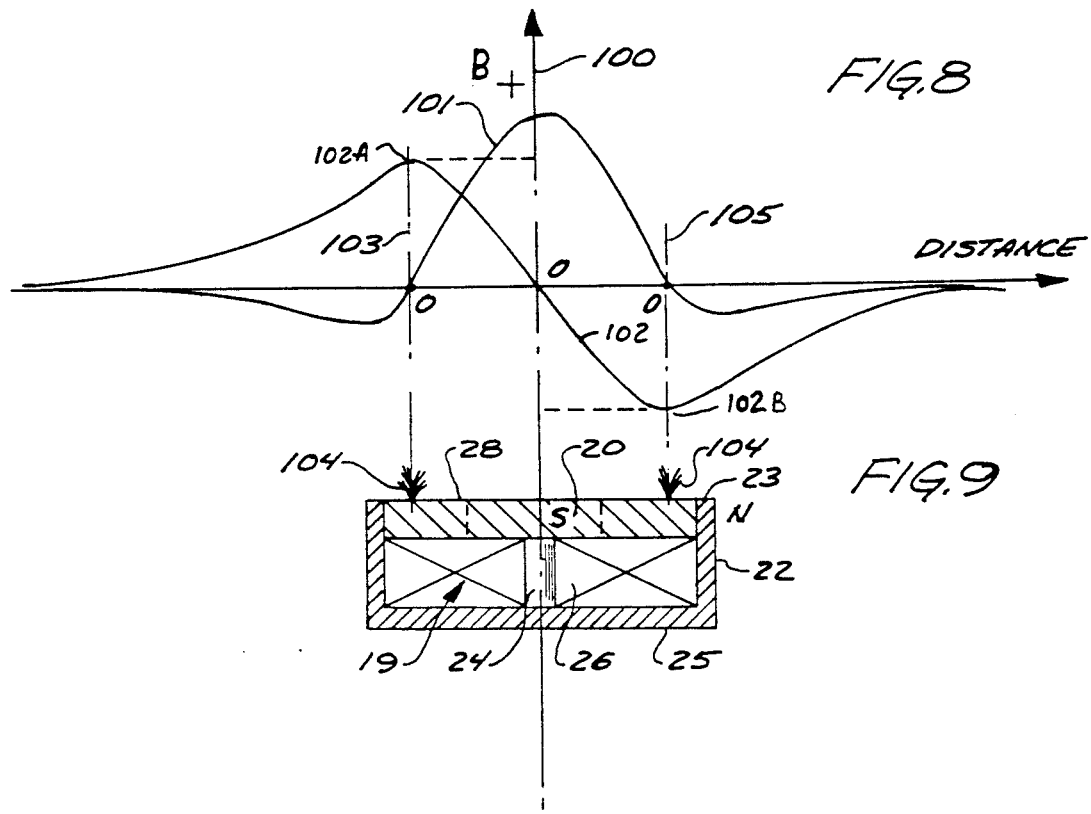
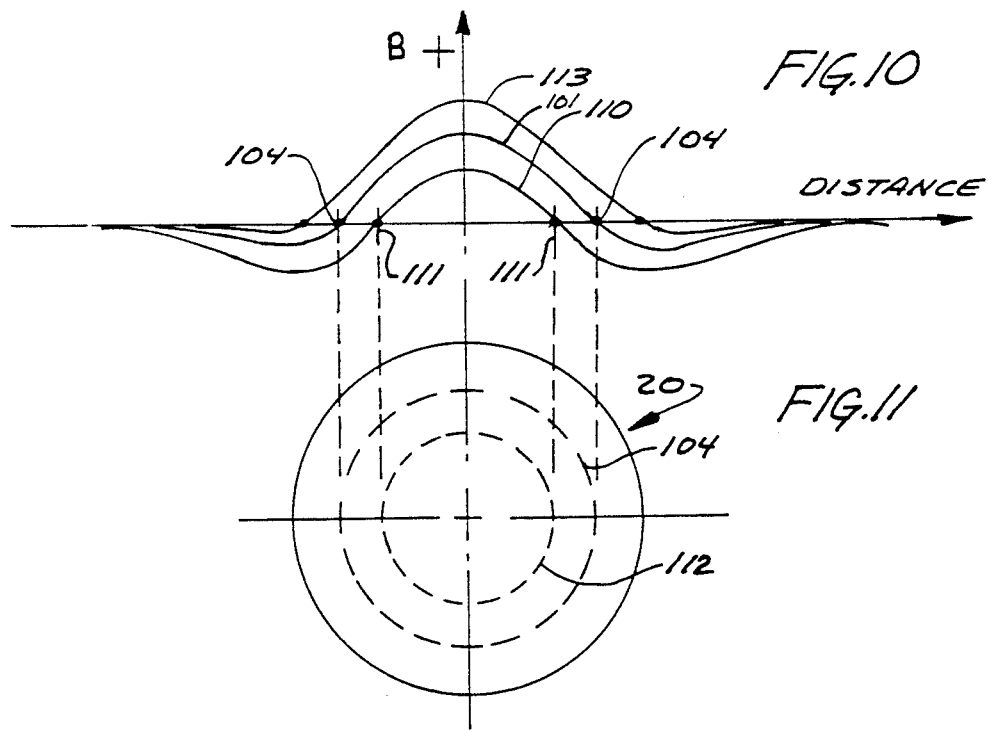

STEERED ARC COATING WITH THICK TARGETS

BACKGROUND OF THE INVENTION

1. Field of the Invention

The present invention relates to steered arc coating processes and apparatus using thick cathodes or targets.

2. Description of the Prior Art

U.S. Pat. No. 4,673,477 discloses a controlled arc coating process and apparatus for coating of materials. The patent teaches the control of an arc path by utilizing a magnetic field positioned in a known relationship with respect to the cathode for defining a closed arc track along which the arc will continuously move.

U.S. Pat. No. 4,563,262 issued to Sablev et al. discloses a method of depositing alloys using a composite target. In this process a random or unsteered arc is employed acting on a composite target of a particular configuration.

U.S. patent application Ser. No. 848,720, filed Apr. 4, 1986, to Ramalingam et al. discloses a steered arc coating process and apparatus where the residents time of the arc is controlled in different parts of a solid composite cathode to permit depositing alloys on a substrate. Mechanical linkages control the arc path by moving the magnet that defines the arc path, and geometric proportioning of the composite cathode as well as arc operating parameters such as current provide the basis for control of a deposited alloy composition.

While the system works well with mechanical linkages, improvements in control of the arc path, and tight arc steering are necessary to produce macro particle free coatings when using thick cathodes or targets so an adequate supply of coating material is available. When the process and apparatus disclosed in the Ramalingam Patent 4,673,477 are used to produce macro particle free deposits, cathode thicknesses are usually restricted to about 20 millimeters (about 13/16 inch) or less. The Ramalingam et al. patent application Ser. No. 848,720, filed Apr. 4, 1986, and the Sablev et al. U.S. Pat. No. 4,563,262 produce coatings on a substrate where the composition change is abrupt at the substrate/deposited film interface. These same prior art disclosures can be used to produce multi-layer coatings, but more than one arc source is necessary to do so.

In any coating it is desirable, and is all but necessary, to have uniformly small grain or crystallite sizes, and thus depositing of macro particles is unsatisfactory, and produces coatings that are not within desired tolerances.

The present invention provides the necessary arc steering for producing macro particle free coatings with thick targets or cathodes, and, when desired, multi-layer coatings using a thick composite cathode.

SUMMARY OF THE INVENTION

A method and apparatus provides an arc generated coating material utilizing a thick cathode or target, which will provide a substantially uniform small grain or crystallite size alloy coating onto a substrate, and when desired, provide multi-layer coatings using a thick composite cathode.

The apparatus and method disclosed provides precise control of the arc path, and where desired, also mechanical control can be used. The arc source and control elements are placed in a vacuum chamber, so that the coating is deposited in a vacuum using known arc generation techniques. A thick cathode that is of suitable size is provided, made of two or more materials, so that an alloy coating or a layered coating can be provided. Electromagnetic fields are generated and controlled for determining the arc path, and trapping the arc to move along a closed path on the cathode surface at a location where the component of the magnetic field normal to (perpendicular to) the cathode surface is zero. A magnetic pole piece assembly is positioned in a desired way to precisely establish the closed path for the arc on the cathode surface of a thick cathode.

By properly selecting the magnet structure, and properly locating it, the size of the arc path can be controlled so that it will traverse the desired portion of the cathode surface, and this in turn will, with a cathode of a suitably selected composite material, yield a vapor flux suitable for thin film deposition of the desired constituents. The size of the arc path can be modulated if desired to move across desired sections of the cathode so that the alloy composition can be continuously varied in a predetermined cycle, by varying the duty cycle of the arc, that is by varying the arc resident time through control of the arc path dimensions. Mechanical devices can also be used for moving the magnetic structure in a desired path.

The various structures shown permit precise electrical and mechanical control of the arc path so that cathodes in the range of 200 to 300 millimeters or more in diameter can be used.

The conventional considerations of having a vacuum chamber that provides for adequate vacuum, and also which permits injection of reactive gases for supporting arcs, and for controlling the composition, are provided, as known in the trade. Water cooled anodes and cathodes are preferably used and again these can be provided in accordance with known procedures. Arc supporting noble gases such as argon, neon and the like can be added to the vacuum ambient, and the vacuum created should be in the order of $10^{-2}$ to $10^{-6}$ millimeter of mercury or less.

The various embodiments show positioning of magnet pole pieces to provide a magnetically created closed path on the working surface of the cathode, in various configurations, in order to obtain the desired coating compositions.

BRIEF DESCRIPTION OF THE DRAWINGS

FIGS. 3 through 7 are separate variations of the construction of the cathode and magnet assemblies illustrated in FIG. 1 used for establishing and controlling an arc path on a cathode.

FIG. 8 is a plot of a typical magnetic field showing vertical and horizontal components of the field in relation to a cathode surface with respect to the center line of a cathode assembly shown in FIG. 9.

FIG. 9 is a sectional view of a cathode and magnet assembly that establishes the field shown in FIG. 8.

FIG. 10 is a schematic representation of the effect of applying a modulated magnetic field to the magnet assembly of FIG. 9 to create a smaller or a larger arc track on a cathode surface.

FIG. 11 is a schematic representation of a cathode working surface showing the arc track of FIGS. 8 and 10 in place.

DETAILED DESCRIPTION OF THE PREFERRED EMBODIMENTS

Figure 1:
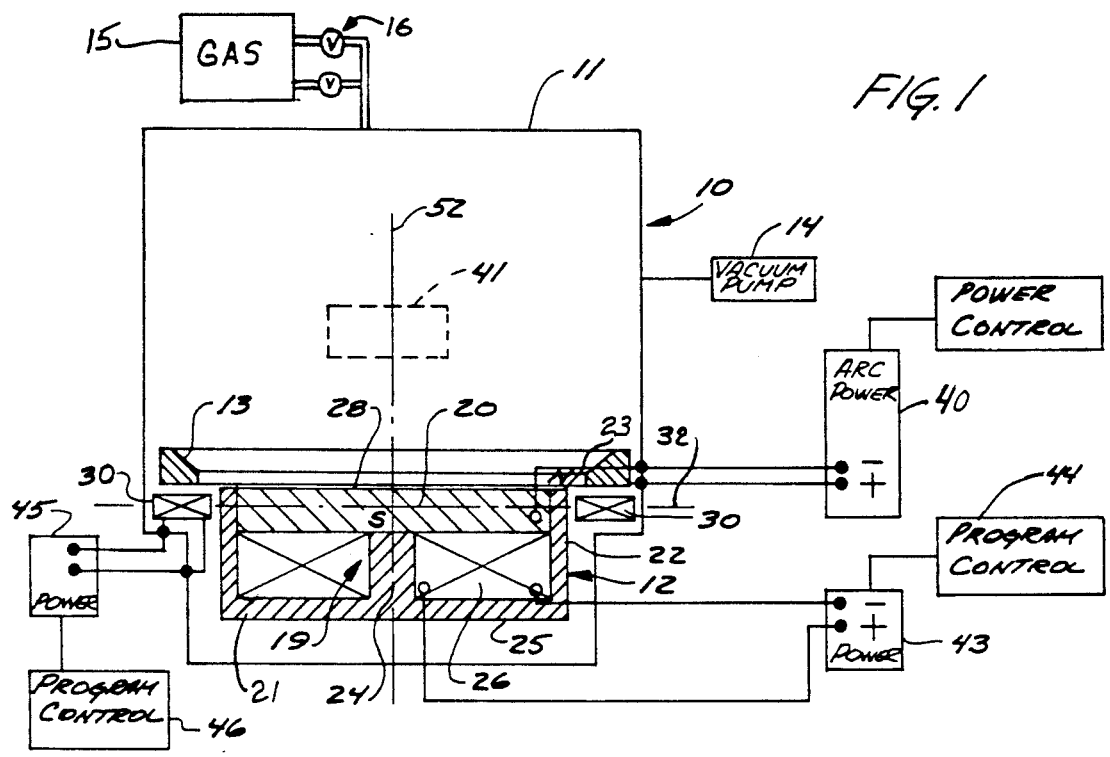
FIG. 1 is a schematic representation of a typical vacuum chamber having anode and cathode arrangements according to the present invention, and utilizing arc steering control according to this invention.

FIG. 1 is a schematic representation of a vacuum arc deposition apparatus indicated generally at 10. Schematically shown is a vacuum chamber 11 in which a cathode assembly indicated generally at 12 is provided, adjacent to a ring type anode 13 which is spaced annularly around the cathode assembly. The cathode and anode assemblies are preferably water cooled, in a conventional manner. Such water cooling is not shown in FIG. 1, in that it is conventional.

The vacuum chamber 11 has a suitable vacuum pump 14 connected thereto to evacuate the interior in a conventional manner, and also a source of reactive or arc supporting gas such as that shown at 15 would be provided through suitable valves at 16 to the interior of the vacuum chamber. Different known gases, or mixtures of gases can be used.

In the form shown, the ring anode 13 is supported relative to the walls of the chamber 11, and relative to the cathode assembly 12 in a suitable manner. Cathode assembly 12 in this form of the invention includes a cathode or target, which is a disk indicated generally at 20 made of suitable material, and which is supported relative to a magnet assembly 19 which includes a cup-shaped pole piece assembly 21. The pole piece assembly 21 has an outer peripheral wall 22 surrounding the cathode or target 20 and having an edge surface 23 forming a first magnetic pole that is flush with the upper surface 28 of cathode or target 20, and having a center pole piece 24 or core (a second magnetic pole) that extends from a base wall 25 to adjacent the lower surface of the cathode or target 20. The outer peripheral wall 22 of the pole piece assembly 21, and a base wall 25, which is fixed to the outer peripheral wall 22, form a chamber in which a flux producing coil 26 is wound. The coil 26 is positioned below the cathode or target 20 and surrounds the central pole piece or core 24.

The cathode assembly 12 can be supported in the housing 11 in any desired manner, with suitable brackets or the like.

Additionally, there is an auxiliary flux generating central coil 30 positioned within the housing 11 and suitably supported so that it surrounds the peripheral wall 22 of the pole piece assembly 21, and is at a level substantially centered on a central bisecting plane indicated at 33 passing through the center of the target 20 and parallel to the active or working surface 28 of the target or cathode 20. The auxiliary coil 30 thus is immediately adjacent the peripheral wall 22, and to the exterior of and slightly below the edge 23 of such wall which forms a pole piece.

An arc generation power supply 40 is provided for controlling and supplying power to the anode 13 and the cathode or target 20, as shown, and this power supply preferably is a constant voltage, constant current power supply, or can be a more simplified power supply if desired. It also can include auxiliary components for igniting or striking the arc in a conventional manner, and will provide adequate power to sustain the arc causing the atmosphere to carry vapor flux that originate from the cathode or target 20 to deposit onto a work piece or substrate that is shown schematically at the dotted lines at 41.

The coil 26 that is mounted in the pole piece assembly 21 is provided current from a power supply 43 through suitable lines, in a normal manner. The power supply 43 is controlled by a program control 44 that can be used for modulating, the magnetic field produced by adjusting the current level, or in other ways controlling the field produced by the coil 26. Program control can be related to the modulation of the coil current as a function of time.

The auxiliary coil 30 is connected to a power supply 45, which also has a separate program control 46 (program controls 44 and 46 can be in a common housing) to control current through lines to the coil 30, to supply power, control and modulate the level of current in the coil 30, or leave power off, depending on the results that are desired, as will become apparent.

Figure 2:
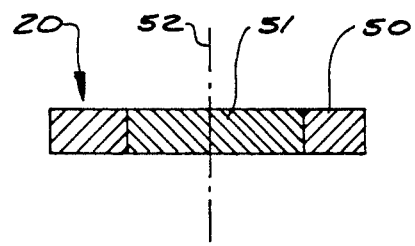
FIG. 2 is a sectional view through a typical cathode made up of composite materials and used with the device in FIG. 1.

In FIG. 2, an enlarged view of the cathode or target 20 is shown. It can be seen that a ring (a target can be round, square, or other shape in plan view) 50 of a first material surrounds a center portion 51 of a second material, and the materials can be centered on the central axis 52 of the cathode or target 20.

In FIG. 1, the north and south magnetic poles of the magnet assembly 19 comprising the pole piece housing 21 and the pole piece or core 24 straddle the cathode or target 20. The north pole, which is at the edge surface 23, is adjacent to or on a level with the working or outer surface 28 of the cathode, and surrounds the cathode or target 20. The opposite pole, in this case the south magnetic pole is located flush with the surface of the cathode opposite from the working surface 28 and centered along the central axis 52 of the cathode. This provides for a particular orientation of the magnetic field generated when the power supply 43 is providing current to the coil 26. The cathode could be made with an annular flange which rested on surface 23. The pole surfce 23 would then be slightly below the working surface.

Various configurations of the pole pieces and the cathode assembly are shown in FIGS. 3–7. In FIG. 3, the cathode assembly is substantially the same as that shown in FIG. 1, except that the central pole piece or core 24 is extended with an extension core portion 24A that extends through the cathode 20A and is then on a level with the working surface indicated at 28 on the upper side of the cathode. Working surface 28 is the surface on which the arc will travel during use. A closed arc path is formed on the working surface 28 where the component of the flux field goes to zero, and the arc will be trapped and retained in that closed path. The additional pole piece or core 24A will modify the location and control parameters of the closed path when coil 26 is energized. The additional pole piece 24A can either be a permanent magnet or magnetically soft material as desired.

The additional pole piece 24A that is shown in FIG. 3 can terminate at a level below the working surface of the cathode if desired.

FIG. 4 shows a further modified version of a cathode assembly, wherein the cathode assembly 12B includes a target member 60, and a magnet assembly 59 including a pole piece assembly 61, and a coil 62 that corresponds to the coil 26. In this instance, an outer peripheral wall 63 forms part of the pole piece assembly and has its wall recessed so that the edge surface 64 forming one magnetic pole (labeled N for north) is at a level even with the surface of the cathode or target 20 opposite from its working surface 28. Edge surface 64 comprises the north pole, as was also the case in FIGS. 1 and 3, but in this instance the north and south poles of the magnet assembly 59 are at a level with and in close proximity to the non-working or opposite surface of the cathode or target 20. In FIGS. 1, 3 and 4, the magnet means employed are electrically excited to create the needed magnetic field, at a desired strength. This is done by adjusting and controlling a base current, $I_o$ from a power supply 43. The power supply connected to the coils shown in the magnet assemblies of FIGS. 3 and 4 in a conventional manner. In all instances, establishment of a controlled arc path on the working surfaces of the respective cathodes is unaffected by interchanging the north and south poles of the magnet assembly. In FIG. 4, the central pole piece or core 65 of the pole piece assembly 61 as shown has its end surface on the same level as the edge surface 64, but the pole piece 65 can be extended so that it extends toward the working surface of the cathode 60, in a manner similar to that shown for extension pole piece 24A in FIG. 3.

The pole piece assemblies 21 and 61 can be constructed of iron or other magnetically permeable materials. The use of magnetically soft materials to construct the pole piece assembly is usually advantageous. An example of a suitable material is an alloy sold under the trademark "PERMALLOY".

FIG. 5 shows a composite cathode structure 70 which includes a magnet assembly 69 comprising an annular permanent ring magnet 71 forming a wall surrounding a disc-like cathode or target 72. Ring magnet 71 is a permanent magnet, having one of its poles at an edge surface 73 that is on a level with the working surface of the cathode or target 72. The opposite pole (or south pole as shown) is near a base wall 77 of a coil support 74. A central pole piece or core 75 is attached to the base wall 77 and extends outwardly therefrom. A flux producing coil 76, corresponding to the coil 26, surrounds the core 75. The magnetic field generated by the permanent ring magnet 71 relative to the cathode or target 72 can be changed by energization of the coil 76 in a desired manner either by providing a steady state field or by modulating the field to achieve a desired closed arc path on the cathode working surface for controlling the arc.

In FIG. 6, a cathode assembly 80 includes a magnet assembly 79, a disc-type magnet 81, that forms the bottom wall of a cathode support assembly 82. The disc magnet has an open center and is magnetized radially so it has one pole (the north pole N as shown) at its outer periphery indicated at 83 and a second pole at the inner periphery of the opening indicated at 84.

The magnet 81 can be magnetized so one pole is on the top and the other is on the bottom, if desired. The pole pieces would be modified to accommodate the disc magnet with magnetization along the thickness direction of the disc so the appropriate flux path is established. A magnetic circuit would be provided so the edge surface of the annular wall would be one magnetic pole and the central core would be the opposite pole.

With the disc magnet magnetized as shown, an outer peripheral support wall 85 is coupled to the outer edge of the magnet 81. The wall 85 forms a support wall for a cathode or target 88. A center pole piece or core 86 in the opening 84 and held in place, is positioned. A coil 87 that corresponds to the coil 26 is wound around the core 86 and is positioned within the peripheral wall 85. The coil 87 can be powered from the power supply 43 through a program control 44 in a desired manner to provide magnetic flux for modifying the flux field on the cathode surface as generated by permanent magnet 81 and its coupled annular pole piece 85 and central pole piece or core 86. The field provided forms a closed path on the cathode working surface where the component of the flux field normal to the cathode surface is zero.

The cathode or target 88 is supported on the top of the coil 87 and is within the annular wall 85, so that the powering to the coil 87 will cause a magnetic field to be created through the wall 85 (which will be of a suitable magnetic material) to modulate the magnetic field generated by the disc magnet 81. The magnetization direction of the disc magnet is parallel to the plane of the disc magnet, and parallel to the working and opposite surfaces of the cathode or target 88.

This type of construction provides for a different modification of the magnet assembly or magnet means for establishing and controlling a closed arc path on the working surface of the cathode or target 88.

FIG. 7 is a further modified form of the cathode assembly usable in FIG. 1, as are the other forms just described, comprising a cathode assembly 90 that includes a magnet assembly 91 that comprises a pole piece assembly having an annular outer wall 92, surrounding a cathode or target 93, and having its upper edge surface 94 parallel to and flush with the working surface of the cathode or target. That is, the edge surface 94, which forms a magnetic pole is at a level or close to the working surface of the cathode or target 93. A prismatic magnet indicated generally at 95 is provided on the central axis of the wall 92, and on the interior of a coil 96 that is used for providing electromagnetic effects through the wall 92. The magnet 95 forms a pole piece or core which is a permanent magnet which has one pole (the south pole as shown) adjacent to the non-working surface of the cathode or target 93 and its opposite pole (the north pole N) is in contact with the upper surface of a lower wall 97 of the pole piece assembly.

The cross-section of the magnet 95 (perpendicular to its length axis) can be any desired shape such as triangular, hexagonal, or other configurations as well as cylindrical, which is shown.

The materials used for the permanent magnets and the pole piece assemblies can be those known in the art, and can be either hard or soft magnetic materials. The magnet means employed can be electrically excited at a base current level to create the needed magnetic field and varied or modulated to provide for the desired changes in the size and/or location of the arc path on the cathode. The magnetic structure design enables construction of pole pieces with moderately small air gaps, which may be true air gaps, vacuum gaps or gaps that are comprised of paramagnetic or diamagnetic materials. The magnets of course cannot be short-circuited where they contact other portions of the assembly, and where construction is completely of hard magnetic materials such as permanent magnets, a magnetically soft pole piece assembly and coil can be used for electrically energizing the permanent magnets for the control desired. Where permanent magnets have been described such as in FIGS. 5, 6 and 7, these can be combined with the soft magnetic materials of the pole pieces that are energized by the coils shown.

In FIGS. 3-7, each of the cathodes or targets can be made of a composite of materials being constructed as shown in FIG. 2, and while the cross sectioning in the same across the surfaces shown, the dotted vertical lines indicated a center section of a different material.

In FIGS. 8, 9, 10 and 11, the construction of a typical cathode assembly and the magnetic fields generated thereby, illustrating the components of the flux field on the cathode working surface such as surface 28 which are parallel to and normal to the working surface of the cathode provided.

In FIG. 8, the center line 100 is projected up from the cathode assembly shown at FIG. 9, the cathode assembly in FIG. 9 corresponds to that shown in FIG. 1 and will be numbered the same. The center line of the second pole piece or core 24 is aligned on center line 100, and upon energization of the coil 26 at a base current $I_o$, a typical pattern of magnetic flux is represented on the graph of FIG. 8. The magnetic flux perpendicular (normal) to the cathode active or working surface is represented by the line 101, and the component of flux parallel to the cathode working surface is represented at 102. For example, the line 103 that is projected down onto the surface of the cathode or target 20 intercepts the graph base line, representing the cathode working surface 28, to form an arc path represented at 104. The vertical line 105 is also where the normal component of the field goes to zero, and the parallel component is at its maximum negative value. The arc path 104 is an annular track in this situation, and is represented also in FIG. 11 by the dashed line 104.

It is at the locus of points where the normal field component goes to zero that the arc path is established and controlled.

Upon providing a modulated current to coil 26 or in other forms to energize the provided coil to modulate a field provided by a permanent magnet, as an opposing field, the location where the normal component of the field goes to zero can be shifted as shown in FIG. 10. In FIG. 10, the curve 101 is again represented, and upon applying an opposing or changed field to that which established the arc track 104, a field component curve representative of the normal component of the magnetic field can be seen at 110, which shows that the location where the normal component goes to zero, represented by the vertical lines 111 move inwardly toward the center line 100. This establishes an arc path or track indicated at 112 in FIG. 11 that would be a different location and/or size than the arc path 104. The size of the arc path an be enlarged by providing a field component represented by curve 113.

Thus, by providing an opposing or changed magnetic field, for example, changing the current in coil 26 and/or by energizing a coil to modulate the magnetic field on the cathode working surface, the position of the arc path can be changed, and by properly programming the excitation of the representative coils used in the cathode assembly, the position of the arc path can be altered as desired.

As will be more fully explained, the field strength is represented by the vertical scale in FIGS. 8 and 10, and the vertical scale of the field component parallel to the cathode working or active surface, that is, the magnitude of that component where the vertical component goes to zero determines in part arc speed of travel around the closed arc path. Thus, the values of the parallel field at points 102A and 102B in FIG. 8 are important to control arc speed of travel around the arc path.

In the present invention, the magnetic poles created are disposed with respect to the working surface of the respective cathodes such that a closed arc path is provided on the working surface of the cathode in a desired manner, and the size and/or position of the arc path formed by the magnetic field can be changed as desired. As stated, the arc path is the closed curve along which the component of the applied magnetic field for establishing the arc path normal to the cathode surface (called the "normal component") is zero. This can be done easily while one of the magnetic poles circumscribes the cathode and with one (or both) of the poles flush or nearly so with the working surface to insure that the magnetic field components are properly located. The ability to relocate the arc path on the cathode surface by modulating the magnetic field, high cathode utilization efficiency is achieved.

The use of separate coils for generating magnetic fields provides the ability to control the radial gradient of the magnetic field applied, that is, the change in the field component normal to the surface of the cathode with respect to a change in radius from a central axis so that tight control over the lateral motion of the arc as it travels the closed path is achieved. The proper gradient prevents the arc from jiggling or dancing from side to side to form a wide path or track. It is thus desired to have the slope of the flux field normal component curve quite steep where the normal component of the magnetic field goes to zero, to insure a narrow path and tight control for the arc. The arc motion along the path and transverse to the arc path can be controlled with the control means disclosed. Controlling the current flow through the arc by regulating the power supply 40 also partly regulates speed of travel of the arc along the path established by the magnetic field, and having a high slope or gradient of the field normal component at the point on the cathode working surface where the normal components go to zero insures a very narrow arc path and eliminates side to side jiggling and to provide tight control of the arc path.

It has been determined that for preventing significant lateral motion, the gradient (slope) of the field normal to the cathode surface should be 5 gauss/mm or greater on either side of the arc path desired, that is, the normal component of the magnetic field should have the desired gradient immediately above and below the working surface of the cathode.

Figure 12:
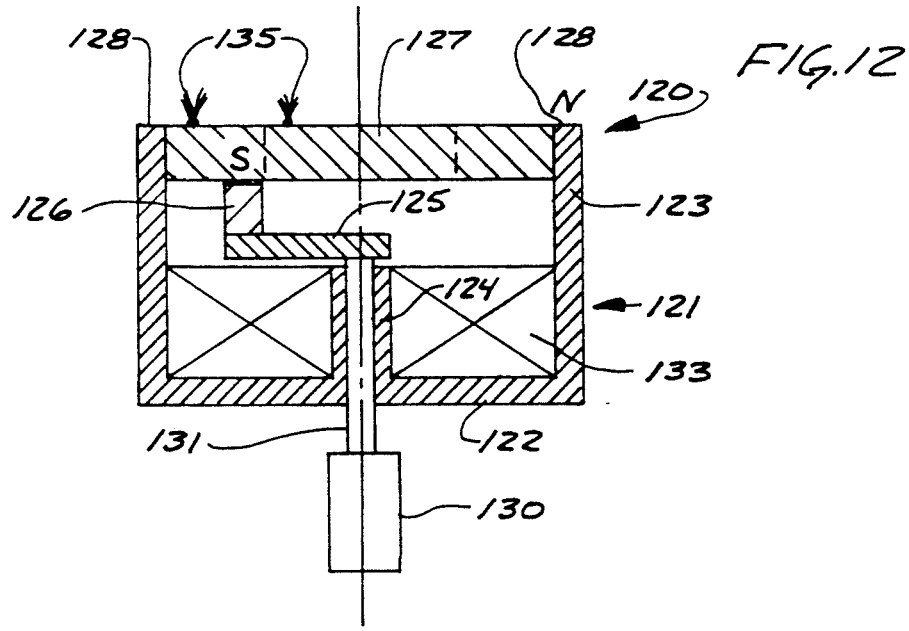
FIG. 12 is a cross sectional view of a further modified cathode and magnet assembly made according to the present invention.

In FIG. 12, a modified cathode assembly indicated generally at 120 is provided, and includes magnet means indicated generally at 121 that is a composite magnet means and has a magnet housing 122 that has an annular wall 123 of soft magnetic material, and a central core or pole piece 124 which is coupled magnetically to an arm 125 and a pole piece 126 that is fixed to the arm and positioned just below the lower surface of a cathode or target 127 that also fits within the annular wall 123. The wall 123 has an end surface 128 that aligns or nearly so with the working or active surface of the cathode 127. A variable speed motor 130 is provided to drive a shaft 131, to rotate the arm 125 as desired. A coil 133 is utilized for providing an electromagnetic field through the housing and wall 123, and as the shaft 131 is rotated, the pole piece 126 will move to different positions below the cathode 127. To change the orientation of flux flow and thus move the arc path represented at 135. The arc path is determined by the position of the pole piece 126, which determines where the normal component of the magnetic field goes to zero on the active surface of the cathode.

Movement of the arm 125 therefore moves the arc path 135 in a sweep across the cathode active surface. A composite magnet can be used for establishing the size of the arc path, as well as its location. The cathode can be made of composite materials.

Figure 13:
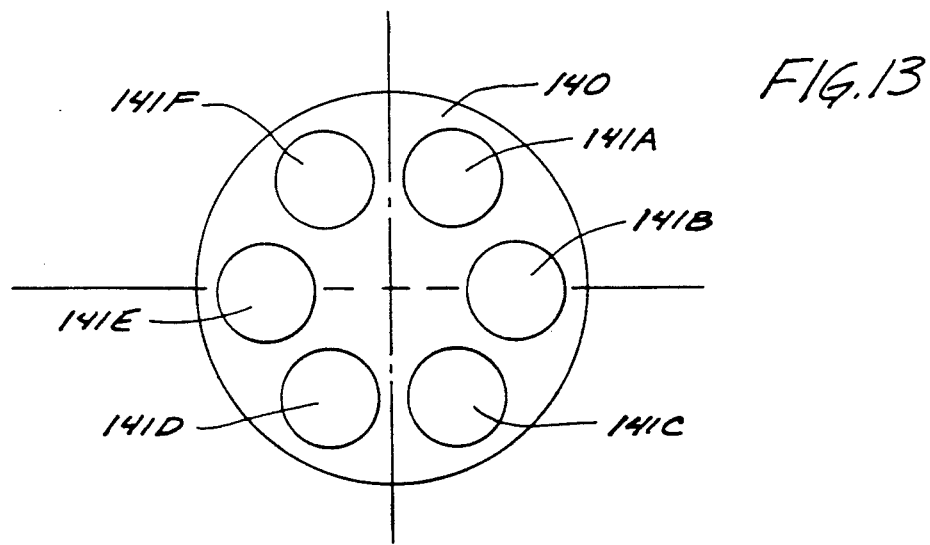
FIG. 13 is a top plan view of a cathode having a plurality of inserts of different material for making composites coating.

In FIG. 13, a cathode or target 140 is illustrated that has a plurality of inserts of different types of materials indicated at 141A, 141B, 141C, 141D, 141E and 141F. These material inserts can all be the same type of material if desired, or each can be of different materials so that as an arc path such as that indicated at 135 travels over the surface of a cathode such as that shown at 140, differing material components will be discharged from the cathode.

Figure 14:
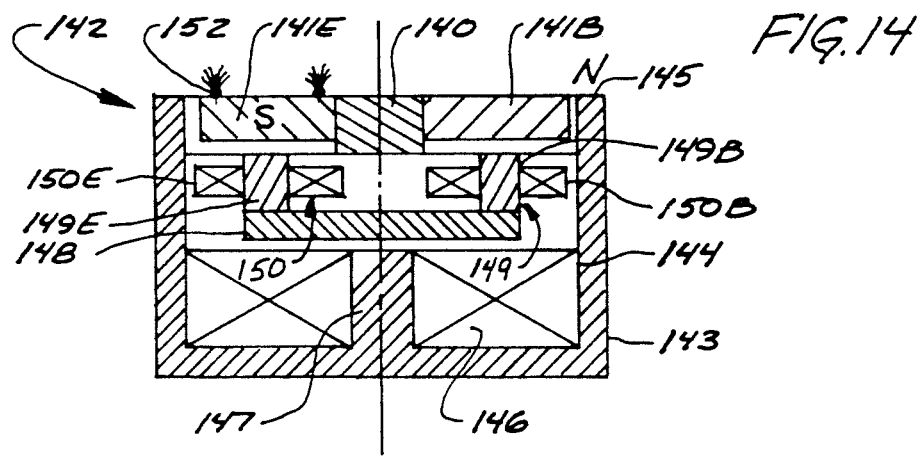
FIG. 14 is a sectional view of a further modified cathode and magnet assembly made according to the present invention.

FIG. 14 shows a further modified form of a cathode and pole piece assembly indicated generally at 142 which can be utilized with the cathode shown in FIG. 13. The cathode 140 is mounted in a magnet assembly 143 that has an outer cylindrical wall 144 supporting the cathode 140 near an outer edge surface 145 of wall 144. The edge surface 145 forms one magnetic pole. A coil 146 is mounted within the wall 144, and surrounds a center pole piece or core 147 that is magnetically coupled to a support plate 148 that in turn has (for example) six pole pieces or auxiliary cores 149 thereon in a form of a spider, so that there is magnetic coupling to the pole pieces 149. The pole piece 149 can be in alignment with the separate cathode inserts 141A-141F shown in FIG. 13. Pole pieces 149B and 149E are shown in FIG. 14. Each of these pole pieces 149 can be surrounded by a separate coil 150 and the coils 150 can be selectively energized, using a separate power source such as power supply 43 operated by a previously explained. The magnetic field from the coils 150 will permit one to control the closed path of an arc indicated by 152 on the cathode 140, or on inserts 141A-141F. Coils 150B and 150E are shown in FIG. 14.

The positioning of the magnetic poles, including the surface 145 and the ends of pole pieces 149, is such that by programmed activation of the coils 150 through the use of the programmed control for the power supply as illustrated previously, the arc path that is represented at 152 can be made to locate at difference positions on the cathode, and on different ones of the cathode inserts. Multi-layer film deposition is easily attained, for example, if the coils 150 are sequentially energized to locate the arc track sequentially on the inserts 141A-141F, a multi-layer coating can be obtained with each of the layers being from a different material.

Another way of controlling the arc location is through the control of the total current to the arc from power supply 40. It is well-known that arc division occurs when the total current in an arc exceeds a critical current $I_c$. $I_c$ partially depends on the cathode material, and by raising the arc current to a value in substantial excess of $I_c$, and energizing two of the auxiliary coils 150, for example the two that are shown in FIG. 14, two separate steered arcs can be established in two preselected cathode inserts, in this instance 141B and 141E shown in FIG. 13. Then, alloy metal or hard compound deposition, is possible. Current to coil 146 can provide a base magnetic field, or it can be modulated as well for arc path control. If the deposition takes place in a reactive ambient atmosphere with controlled admission of reactive gases such as nitrogen, control of the hardness of the coating can easily be attained. When electrical selection of the cathode inserts of a composite target such as that shown in FIG. 13 for arc placement is carried out, using the apparatus of FIG. 14, magnetically soft materials to construct the pole pieces 145 and 149 is desired. Segments of the support member 148 or pole pieces may be constructed fully or partially with magnetically hard materials, that is permanent magnet materials, if desired. The support 148 is supported on materials to form an air gap with respect to core 147 and coil 146.

Figure 15:
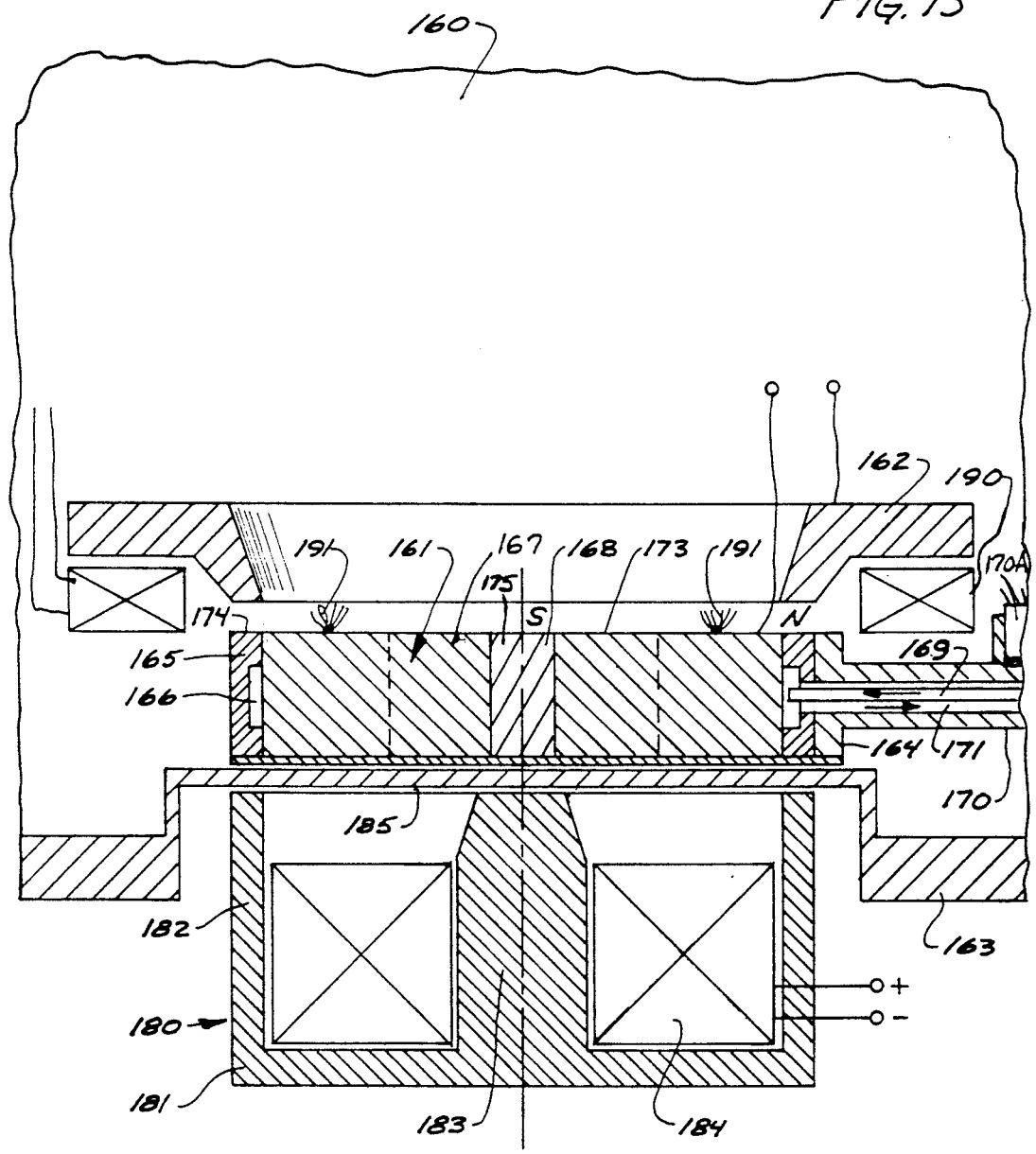
FIG. 15 is a cross sectional view of a cathode and anode, shown positioned in a vacuum chamber, with control portions positioned outside of the vacuum chamber wall.

FIG. 15 shows a more complex device utilizing the principles of construction previously explained. In FIG. 15, a vacuum chamber indicated at 160 has a cathode assembly 161 positioned therein, and an anode 162 that surrounds the cathode and forms a ring-type anode as shown. The vacuum chamber has a lower wall 163 forming a portion of the enclosure. In this form of the invention, the detail of the water cooling channels for the cathode assembly is more fully shown. An outer ring 164 is used for mounting an annular pole piece 165 made of magnetically soft material, and the pole piece 165 has an inner channel 166 that provides a sealed ring around an annular cathode or target 167 that has a center pole piece 168 therein. Water is introduced into a tube 169 mounted in a outer sleeve 170, and this water is introduced into the channel 166 and then is discharged out through a tubular passageway 171 formed between the tube 169 and the sleeve 170. The water controls can be any desired type of control.

The anode 162 and the cathode 167 have suitable leads shown schematically, that lead to a suitable arc power supply.

In this form of the invention, the cathode or target 167 has an upper surface 173 that is on a level with the upper surface 174 of the outer ring-type pole piece 165, and with the upper surface 175 of the pole piece 168. It can be seen that these pole pieces comprising the cathode assembly 161 are spaced from the bottom wall 163 by an air gap, or can be supported on a non-magnetic material. A magnet assembly indicated generally at 180 is provided on the exterior of the lower wall 163 of the vacuum chamber, and comprises an outer pole piece assembly housing 181 that has an outer annular pole piece 182, and a center pole piece or core 183. A magnetic field control coil 184 is mounted within the annular wall 182, and surrounding the pole piece 183. The pole pieces 182 and 183 end on a plane shown. generally at 185, which is spaced from the lower side of the bottom wall 163 of the vacuum chamber. The pole pieces 182 and 183 are magnetically coupled to the pole pieces 165 and 168, respectively, so the magnetic flux is carried to the cathode.

The sleeve 170 comprises a pivoting arm or movable arm supported with a hub shown schematically on a pivot pin 170A so that the cathode can be moved relative to the anode out of registry with the anode. The anode also can be mounted for movement to obtain the desired results.

An auxiliary control coil 190 is mounted adjacent the anode 162 and surrounds the pole piece 165, and has suitable leads leading to a power supply such as the power supply previously described, for energization to offset arc impedence changes accompanying arc path dimension changes created by exciting the coil 184. A modulating field, created and maintained by the coil 184, is used to cause the arc to sweep the cathode while following the established arc track or path. The arc path is represented at 191 and this arc path can be changed in size and position by altering the magnetic field generated by the coil 184. The diameter of the arc path is varied using the coil 184 to distribute the arc erosion regions on the cathode surface.

The auxiliary coil 190 can be used to offset arc impedence changes as desired and also change the arc impedance if desired to change arc current without adjusting the arc power supply when constant voltage is provided. This same effect can be obtained with coil 30. The change in impedance changes the arc current when a constant voltage is used. Changes in arc current influences changes in the speed of travel of the arc in its closed path, so controlling current to the auxiliary arc provides for a way of changing the effective location of the anode, that is, changing the arc impedance.

Once a cathode is consumed by extended operation, arcing may be terminated by swinging the cathode assembly away, utilizing the swinging arm or sleeve 170, and then the next cathode assembly can be swung into place, the arc ignited and steered to continue film deposition to secure thick film deposits.

Magnetic means, including the pole piece assemblies shown, can be constructed from soft, hard and composite magnetic materials. Permanent magnets can be combined with the electromagnets, and the magnetic poles are positioned straddling the cathode in such a way that the cathode's thickness is no longer a significant limitation for establishing a closed arc path on the cathode working surface. This is done by having at least one of the poles up to the plane of the cathode surface that is the working surface. The ability to select and control the position of the arc path on the cathode surface without mechanical movements and without breaking the vacuum is a feature of the invention.

As disclosed, alloyed deposited coatings on a substrate or part are obtained by rapidly modulating the size of the arc path. This is accomplished by varying the position of the magnetic field of the magnet means defining the arc path. The alloy composition can be continuously varied on a predetermined basis. The duty cycle of the arc, that is, varying the arc residence time through control over the arc path dimension using a single cathode. but of composite materials results in providing the coating composition variations. Introducing reactive gases into the chamber for deposition by regulating valve 16 from gas source 15, permits a wide range of alloyed hard compounds to be formed.

Also, by making one portion of the cathode of the same material as the substrate or part on which the coating is to be deposited, it is possible to have a graded substrate-deposited film interface. In other words, the substrate can have an initial deposition of a film of the same material as the substrate and then the film or coating can be changed to a desired alloy as the coating thickens. The graded interface between a part or substrate and the coating are advantageous, for example, when thermal expansion coefficients of the substrate or part and the film differ substantially. This is the case when hard compounds such as titanium nitride, zirconium nitride, titanium carbonate and the like are deposited over metallic or polymer substrates.

To secure graded interfaces, the arc is ignited and the arc path is selected as previously explained, so that the path is entirely within the substrate material part of the composite cathode. For example, if the composite cathode has a center section such as that shown in FIG. 2 which is made of the same material as the part or substrate, the magnetic field would be controlled so that the arc path would be entirely within that particular portion 51 of the cathode. The arc path dimensions are then modulated by varying the strength of the current to the coil in the magnetic means, as well as to the coil 30, which may also provide path control as well as arc current control, so that the arc would follow a path partially on each section of material of the cathode. Then increasingly larger contributions to the film being deposited from the second or outer part 50 of the cathode are selected so that over a preselected period of time the coating deposited on the substrate would eventually change in composition from the substrate-film interface to a hard coating selected primarily by arc path size modulation.

The thickness of the graded interface is controlled by varying the time duration over which the arc is shifted from one cathode portion to the other. Rapidly modulating the arc path size between the different components of the composite target or cathode and causing the arc path to remain on each part of the cathode for a fixed, preselected time duration results in a multi-layer film deposition. In other words, by having a multiple material cathode, and the ability to tightly control the arc path, a multi-layer film can be deposited merely by shifting the path from time to time as desired from one portion of the cathode to the other to obtain the desired components for the coating that is being deposited. Graded interfaces between the layers of a multi-layer coating can be obtained in the same manner as described for obtaining a graded interface between the substrate material and the film.

Varying the position of the arc path relative to the materials forming the cathode permits this arrangement. An advantage over the prior art is that no specific indexing or orientation of the cathode materials in a composite target is necessary. In other words, the cathodes do not have to be constructed as shown in the prior art in precise locations, because the arc path can be positioned magnetically and thus the various materials forming the cathode can be positioned so that the expensive materials can occupy smaller regions of the composite cathode to make its use economical.

Magnetron sputtering, which is a prior art technique, does permit deriving compositional changes in films deposited by the modification of the applied field. The magnetron sputtering technique redirects the electron trajectories to alter sputtering rates in different regions on a composite target to provide changing the composition of the coating. In the present invention on the other hand, the arc root of a high current, low voltage arc discharge is controlled and moved, which requires control over the ion motion. In the present device and method by using magnetic fields, specific regions of a composite cathode can be rendered completely inactive as vapor sources, while other portions are used as vapor sources, which cannot be done with magnetron sputtering with modulated magnetic fields.

The ability to specifically obtain vapor from the desired material on the cathode by precisely controlling the arc position enables deposition of distinctly different multi-layer coatings from a single composite cathode. The arc path and trajectory dimensions are controlled, as taught herein.

As previously stated, arc velocity in the arc path defined depends in part on the magnitude of the component of the magnetic field parallel to the cathode surface at the location where the normal component is zero, the normal component zero points in turn define the arc path. By choosing the value of the field component parallel to the cathode ("parallel field"), arc velocities of a few meters to a few tens of meters per second can be obtained, and by steering the arc to traverse the closed path repeatedly, the temperature of the cathode along the arc path is raised sufficiently to produce a shallow molten track or path. The molten track surpresses macro particle formation in the vapor formed and thus results in higher quality, uniform coating. This is desirable, and results in a differential vapor pressure distribution between the path and the rest of the cathode surface which serves to stabilize the arc path on the cathode surface initially created by the magnetic field distribution alone. The vapor pressure distribution in the arc path results in a tendency of the arc to continue to follow the established arc path and aids in keeping the arc path controlled. The vapor pressure aids in obtaining continuous arc discharge.

In FIG. 8, the value (B) of curve 102 along the vertical scale shows the value of the parallel field. At points 102A and 102B the parallel field value are maximum and the normal field is zero. A large value at points 102A and 102B insures high arc travel speed in the arc path established by the magnet means.

In the prior art, where there was extended arc operation over the same track or path, there would be severe local evaporative loss of material so that a deep groove would be quickly formed resulting in inefficient cathode utilization.

For example, in FIG. 1 if a permanent magnet pole piece or a base current coil 26 is utilized to establish an arc track through the north and south poles shown (also as shown in FIGS. 3 and 4) energizing or changing the current to the coil 26 through the use of a program and power supply 43 will create a charged magnetic field that is superimposed on or varied from the original field. This effect is shown by the changes in the positions of arc paths illustrated in FIGS. 10 and 11 to make the arc path smaller if the coil field is opposing a permanent field or reduced from the reference field. In contrast, the application of an aiding field (or increased field) by properly directing the current through the coil 26 forming part of the magnet means creates a larger arc track that is illustrated by the upper curve 113 in FIG. 10. The unmodulated original field is the intermediate curve 104 and the resulting path is illustrated by the ring 104 in FIG. 11.

The modulating magnetic field that is created by controlling the current to the coil from the magnet power supply 43 utilizing program control 44 controls the arc path dimensions and thus prevents grooving of the target cathode by modulating the field between desired parameters utilizing the program control 44.

In the situation where the pole assembly 21 is made without hard magnetic materials (that is, without any permanent magnet), an initial current $I_o$ of sufficient magnitude is applied to the coil 26, or the other coils illustrated, such that the closed arc path is entirely on the cathode surface when first established. The arc is then ignited, and is trapped along the preselected trajectory or path, and is steered along this trajectory. Again, the speed of the arc travel in the path is controlled by the parallel field component. Once the arc is stabilized by the creation of a molten track in this path, the applied current to the coil 26, or the other coils utilized, is modulated to change the path of the arc as shown illustratively in FIGS. 10 and 11 to raise the cathode use efficiency.

The pole piece assembly in the cathode assembly shown in FIGS. 3, 5, 6 and 7 serves to establish the normal field illustrated in FIG. 8, and the same type of field can be attained with the structure shown in FIGS. 1 and 4 by using a base current $I_o$ in the coil 26 or 62. In the absence of the base current $I_o$, in these two figures, the arc tends to wander uncontrollably and in fact may migrate to side surfaces of the cathode. Film contamination and/or damage to apparatus is then possible, so the use of a base current $I_o$ is desirable in instances where the system design follows the cathode construction and pole piece construction of FIGS. 1 or 4.

The permanent magnets shown in FIGS. 3, 5, 6 and 7 are intended to offset the need for a base current, because they establish a permanent magnetic field that defines an arc track where the normal component of the field, that is, the component of the field normal to the working surface of the cathode, goes to zero. The use of a permanent magnet such as is shown in those figures is a failsafe design in the event of failure of the power supply leading to the coil that is provided. This danger is inherent to designs such as that shown in FIG. 1, where no permanent magnet is installed, or in FIG. 4.

It should be noted that as the arc steering field is modulated, that is, the magnetic field is modulated in the form shown in FIG. 10, the arc impedance is raised or lowered depending on the bias field applied, in the same manner as when auxiliary coils 30 or 190 are energized. When conventional arc power supplies, such as arc welding power supplied and their modifications with a current voltage load line with a negative slope, are used the arc voltage and current both vary with the applied bias fields. To offset this variation in arc voltage and current when constant power arc source supplied are used, the anode may be moved radially or axially, or both to minimize arc current/voltage fluctuations. The anode motion would be relative to the cathode for accomplishing this purpose. However, the use of regulated power supplied that give constant current and constant voltage allows the arc source operation at a constant voltage or constant current and eliminates the need for having any anode motion. Thus, this type of supply is preferred.

Auxiliary magnetic fields created in the vicinity of the anode by one or more secondary coils, such as that shown at 30 or 190, as powered by power source 45 and program control 46 are frequently advantageous, for changing or modulating the arc path on the cathode surface. The auxiliary coils also help to minimize the consequences arising from varying arc impedance, but such auxiliary coils are not absolutely essential to the operation of the steered arc coating process and apparatus disclosed herein. Magnetic fields generated by the auxiliary coils 30 or 190, as stated before, can be used for controlling arc impedance, which effectively gives the same results as shifting the anode, or changing the arc power supply to change the arc current.

It should be noted that the chamber walls or auxiliary walls can be made the anode of the arc source if desired.

The structure shown in FIG. 12 is useful if simple, common arc welding power supplied are used. The movement of the magnetic pole 126, mounted on element 125 will redirect the flux to obtain the arc track which is shown and illustrated in FIG. 12. Sweeping of the arc across the cathode working surface can then be accomplished, using water or gas powered motors, as well as the electric motor shown at 130. The modulation of the arc path also can be achieved with the structure shown in FIG. 12 by controlling current to the coil 133, in the same manner as previously explained.

If permanent magnets are used, the coil current is used to modify the field from the permanent magnets, and if a base current $I_o$ is utilized for establishing the initial magnetic field, then changes in that current would be utilized for obtaining the modulation desired. Variations of the pole piece assembly can be made with the device of FIG. 12 as well, wherein one pole of the magnet means is moved, and as shown the central south pole is moved relative to the north pole forming the annular wall without losing control over the arc path. In all of the instances shown, the north and south poles can be reversed from that shown without losing control over the arc path.

More complex motions can be provided to one pole with respect to the other by utilizing well known motion producing apparatus such as a cycloidal motion, obtained by modifying the kinematic linkage. Geneva motions, or indexing assemblies are other forms of mechanical linkages also can be used.

The obtaining of various coating compositions, and multi-layer coatings utilizing the structure shown in FIGS. 13 and 14 also has been explained. With the device shown in FIG. 14, selectively exciting a plurality of coils that each surround separate poles or pole pieces of a pole piece assembly provides for steering the arc and locating it at a desired location, and then trapping it in an arc path on one of the cathode inserts. By altering the current through coil 146, the effective arc path can be modulated. As previously stated, when an excess of arc current above a critical current $I_c$ is provided, the arc will divide, and by properly energizing the appropriate magnetic coils of the apparatus of FIG. 14 the magnetic poles used straddle the cathode to provide arc path control on thick cathodes at a selected time, a second or third closed arc path can be defined on the cathode surface.

Although the present invention has been described with reference to preferred embodiments, workers skilled in the art will recognize that changes may be made in form and detail without departing from the spirit and scope of the invention.

What is claimed is:

1. An apparatus for depositing a metal film onto a substrate using arc deposition techniques including a cathode target having an active surface, and a peripheral edge surface defining a perimeter, said edge surface defining a thickness of the cathode, an anode, power supply means for forming an arc between the anode and cathode which arc travels on the cathode active surface, magnet means mounted adjacent said cathode, including a magnetic peripheral pole piece representing one magnetic pole that surrounds the peripheral edge surface of the cathode and at least partially overlaps the peripheral edge surface, and a second magnetic pole piece positioned within the peripheral pole piece to establish a magnetic field between the pole pieces across the cathode active surface on which the arc is formed at a locus of points defining a closed path where components of the magnetic field normal to the cathode active surface go substantially to zero on the cathode active surface for forcing the arc to move in such closed path, and coil means for adjusting the magnetic field to change the location of the closed path where the normal components of the magnetic field go to zero on the surface of the cathode and for providing sufficient magnetic flux to control the arc for movement on the cathode active surface only in such path.

2. The apparatus as specified in claim 1 wherein said coil means is positioned within said peripheral pole piece and surrounding the second pole piece.

3. The apparatus of claim 1 wherein the peripheral pole piece has an edge surface terminating on a plane substantially at a level of the cathode active surface.

4. The apparatus as specified in claim 1 wherein the second pole piece and the peripheral pole piece both terminate on a level substantially along the active surface of the cathode.

5. The apparatus as specified in claim 1 wherein said magnet means includes a permanent magnet comprising the peripheral pole piece and means to control current to the coil means to achieve the desired magnetic field orientation.

6. The apparatus as specified in claim 1 wherein said second pole piece is formed of a permanent magnet that is magnetically coupled to the peripheral pole piece to provide a path for magnetic flux from the permanent magnet through the peripheral pole piece and the second pole piece.

7. The apparatus as specified in claim 1 wherein the cathode is a substantially flat disc shape and has a plane along the flat surface of the cathode, said magnet means including a disc magnet substantially parallel to the cathode plane and having a central opening in which the second pole piece is mounted, and magnetically coupled thereto, said disc magnet having an outer peripheral edge in magnetic circuit communication with the peripheral pole piece.

8. The apparatus as specified in claim 1 and means to mount said second pole piece for movement within said peripheral pole piece relative to the cathode on a side of the cathode opposite from the active surface.

9. The apparatus of claim 8 wherein said second pole piece is mounted on a crank arm that rotates about an axis generally centrally located with respect to the peripheral pole piece, and the second pole piece being offset from said axis so that the second pole piece moves in an annular path of a diameter less than the diameter of the peripheral pole piece.

10. The apparatus as specified in claim 1 wherein said cathode comprises at least two separate portions each of a material dissimilar from the other, said arc path being selectively controllable to span at least portions of both of said separate portions of the cathode.

11. The apparatus as specified in claim 1 and an electromagnet having first and second poles that are coupled magnetically to the peripheral pole piece surrounding said cathode, said electromagnet being located outside of a chamber in which the cathode is mounted.

12. The apparatus as specified in claim 11 wherein the anode has a central axis perpendicular to the active surface of the cathode, and means for mounting said cathode for movement transversely of the axis of said anode.

13. The apparatus as specified in claim 1 wherein the second pole piece extends through the cathode, the peripheral pole piece and second pole piece having surfaces substantially flush with the active surface of the cathode.

14. The apparatus of claim 1 including means for establishing a gradient of 5 gauss/mm of distance along the cathode, or greater of the components of the magnetic field normal to the cathode active surface at location on the cathode active surface where the components of the magnetic field go to zero.

15. A method of providing for arc deposition coating onto a substrate in a chamber, comprising establishing an arc between an anode and a cathode, said cathode comprising a disc having a substantial thickness, a peripheral edge surface around the cathode and an active surface on which an arc is formed, establishing a magnetic field that forms a closed arc path on a portion of the cathode, said path being formed where the component of the magnetic flux substantially perpendicular to the active surface of the cathode has a value of substantially zero, said establishing step including the steps of placing a first peripheral magnetic pole surrounding and at least partially overlapping the peripheral edge surface of the cathode, and providing a second magnetic pole centrally located within the perimeter of said first peripheral magnetic pole, and thereafter controlling the magnetic field so that the magnetic field is established with the defined arc path at a desired location on the cathode.

16. The method of claim 15 including varying the strength of the magnetic field by adjusting current to an electromagnetic coil positioned within the first peripheral magnetic pole.

17. The method of claim 15 including varying the strength of the magnetic field on the active surface of the cathode, and the position where the component of such field normal to the active surface goes to zero by energizing a second coil positioned to effect the established field between the first and second magnetic poles.

18. The method of claim 17 including the step of controlling the magnetic field to provide a substantial value to the field strength acting substantially parallel to the cathode active surface at location of the arc path.

19. The method of claim 15 including the step of providing a plurality of second magnetic pole pieces within the perimeter defined by the first magnetic pole at desired positions below the cathode, and providing a separate coil around each of the second pole pieces, and controlling the current in each of said coils in a desired manner to adjust the magnetic field and the arc path to a desired location on the cathode active surface.

20. The method of claim 19 including the step of increasing the current to an arc formed to cause such arc to form a separate arcs at different locations on the cathode, and controlling each of separate arcs in a separate defined arc path utilizing the magnetic fields from the plurality of second pole pieces and separate coils.

21. The method of claim 15 including the step of controlling the magnetic field to regulate impedance of an arc established between the anode and cathode.

22. The method of claim 15 including the step of providing a vapor from the arc discharge which changes in consistency as a function of position of the arc path on the cathode by providing a cathode having at least two sections, each section being of a different material, and controlling the location of the arc path to be at desired positions relative to the cathode sections.

23. The method of claim 22 wherein the arc path is varied to traverse both of the sections of the cathode in a pattern that varies at different times to change the composition of the vapor formed to provide material coating gradients of different compositions on the substrate.

24. The method of claim 22 including the steps of providing a cathode section having a material substantially the same as the substrate, and commencing deposition with arc path substantially only on the cathode section of the same material as the substrate and after a selected time moving the arc path location of travel at least partially over a second cathode section of different material from the substrate material.

25. The method of claim 15 including the step of changing the position of the arc path by adjusting the magnetic field so that main portions of the cathode are substantially uniformly eroded by the action of the arc on the active surface of the cathode.

26. A method of arc coating a part forming a substrate comprising the steps of:
providing an anode and a cathode having an active surface and a peripheral edge surface;
establishing an arc between the anode and the active surface of the cathode;
providing a magnetic field generating means including a first magnetic pole surrounding and at least partially overlapping the peripheral edge surface of the cathode and a second magnetic pole within the perimeter of the first magnetic pole to establish a field that forms a closed path defined by locations where the component of the magnetic field generally normal to the active surface of the cathode goes to substantially zero to control the arc to move only in such closed path;
controlling the speed of travel of the arc and the size of the closed path to maintain the surface of the cathode in a molten state in the closed path; and
varying the magnetic field to change the position of the closed path on the cathode active surface.

27. The method of claim 26 wherein the step of varying the magnetic field comprises having at least two separate coils for providing magnetic fields affecting the location and size of the closed path.

28. An apparatus for depositing a metal film onto a substrate using arc deposition techniques including a cathode disc target having a central axis, an active surface extending transversely of the central axis, and a substantial thickness in direction along the central axis, an anode, power supply means for forming an arc between the anode and the cathode active surface, magnet means mounted adjacent said cathode including a peripheral pole piece representing one magnetic pole, and a second pole piece positioned within the peripheral pole piece to establish a field of magnetic flux across the cathode active surface on which the arc is formed at a locus of points defining a closed path where components of the magnetic field normal to the cathode active surface go substantially to zero on the cathode active surface and which form a closed path, the arc being forced to move in such closed path, said cathode disc having a main portion and plurality of inserts of dissimilar material from the main portion of the cathode disc, each of said inserts comprising a separate piece from the other inserts, and the inserts being positioned to have centers substantially at the same radius from the central axis of the cathode disc as the other inserts, said second pole piece comprising a plurality of second pole portions substantially in registry with each of the inserts of dissimilar material, and a separate coil surrounding each of said second pole portions, said coils being controllable to vary the magnetic field at each of said second pole portions individually, whereby the closed path of arc travel may be formed on selected parts of the cathode disc, including portions of each of the inserts of dissimilar material by adjusting the magnetic field to change the location of the closed path where the components of the magnetic field normal to the cathode surface go substantially to zero on the cathode active surface and for providing sufficient magnetic flux to control the arc for movement only in such closed path.

* * * * *